United States Patent
Matsuda et al.

(10) Patent No.: US 11,644,121 B2
(45) Date of Patent: May 9, 2023

(54) GAS INSPECTION METHOD, SUBSTRATE PROCESSING METHOD, AND SUBSTRATE PROCESSING SYSTEM

(71) Applicant: Tokyo Electron Limited, Tokyo (JP)

(72) Inventors: Risako Matsuda, Miyagi (JP); Norihiko Amikura, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 255 days.

(21) Appl. No.: 17/189,804

(22) Filed: Mar. 2, 2021

(65) Prior Publication Data

US 2021/0301942 A1 Sep. 30, 2021

(30) Foreign Application Priority Data

Mar. 24, 2020 (JP) .............................. JP2020-052394

(51) Int. Cl.
*F16K 37/00* (2006.01)
*G01F 1/34* (2006.01)

(52) U.S. Cl.
CPC ............ *F16K 37/0091* (2013.01); *G01F 1/34* (2013.01)

(58) Field of Classification Search
CPC .............................. F16K 37/0091; G01F 1/34
See application file for complete search history.

(56) References Cited

U.S. PATENT DOCUMENTS

| | | | | |
|---|---|---|---|---|
| 6,125,869 | A * | 10/2000 | Horiuchi | G05D 7/0635 137/486 |
| 10,692,743 | B2 * | 6/2020 | Miyoshi | H01J 37/32834 |
| 10,871,786 | B2 * | 12/2020 | Miyoshi | G01F 1/36 |
| 2018/0374726 | A1 * | 12/2018 | Miyoshi | H01J 37/32449 |
| 2019/0354120 | A1 * | 11/2019 | Takijiri | G05D 7/0652 |
| 2020/0312680 | A1 * | 10/2020 | Shimizu | H01L 21/67063 |
| 2021/0111004 | A1 * | 4/2021 | Sawachi | H01L 21/3065 |

FOREIGN PATENT DOCUMENTS

JP 20170117055 A * 1/2017
JP 2017-059200 A 3/2017

* cited by examiner

*Primary Examiner* — John Fitzgerald
(74) *Attorney, Agent, or Firm* — Nath, Goldberg & Meyer; Jerald L. Meyer; Tanya E. Harkins

(57) ABSTRACT

A gas inspection method includes: inputting a signal for opening a secondary valve; measuring, by a secondary pressure gauge, a pressure P on a downstream side of an orifice of a flow rate controller at a time point when a period t elapses from the input of the signal for opening the secondary valve; measuring, by the secondary pressure gauge, a standard deviation σ of the pressure P on the downstream side of the orifice of the flow rate controller at the time point when the period t elapses from the input of the signal for opening the secondary valve; and determining whether or not an open degree of the secondary valve is normal by comparing the pressure P and the standard deviation σ of the pressure P with a threshold value P0 of the pressure and a threshold value σ0 of the standard deviation of the pressure.

10 Claims, 4 Drawing Sheets

GAS INSPECTION METHOD, SUBSTRATE PROCESSING METHOD, AND SUBSTRATE PROCESSING SYSTEM

CROSS-REFERENCE TO RELATED APPLICATION

This application is based upon and claims the benefit of priority from Japanese Patent Application No. 2020-052394, filed on Mar. 24, 2020, the entire contents of which are incorporated herein by reference.

TECHNICAL FIELD

The present disclosure relates to a gas inspection method, a substrate processing method, and a substrate processing system.

BACKGROUND

Patent Document 1 discloses a method of inspecting a gas supply system for supplying a gas into a processing container of a substrate processing apparatus. The gas supply system includes a plurality of first pipes connected to a plurality of gas sources, respectively, a plurality of first valves provided in the plurality of first pipes, respectively, a plurality of flow rate controllers provided at downstream sides of the plurality of first pipes and connected to the plurality of first pipes, respectively, a plurality of second pipes provided at downstream sides of the plurality of flow rate controllers and connected to the plurality of flow rate controllers, respectively, a plurality of second valves provided in the plurality of second pipes, respectively, a third pipe provided at downstream sides of the plurality of second pipes and connected to the plurality of second pipes, and a third valve provided in the third pipe.

PRIOR ART DOCUMENT

Patent Document

Patent Document 1: Japanese laid-open publication No. 2017-59200

SUMMARY

An aspect of the present disclosure is a gas inspection method of inspecting a gas supply configured to supply a gas into a chamber. The gas supply includes a pipe configured to connect a gas source and the chamber to each other, a flow rate controller provided in the pipe, a primary valve provided on an upstream side of the flow rate controller, and a secondary valve provided on a downstream side of the flow rate controller, and the flow rate controller includes an orifice, a primary pressure gauge provided on an upstream side of the orifice, and a secondary pressure gauge provided on a downstream side of the orifice. The method includes: (a) setting, in the flow rate controller, a threshold value P0 of a pressure on the downstream side of the orifice of the flow rate controller at a time point when a period t elapses from an input of a signal for opening the secondary valve, and a threshold value σ0 of a standard deviation of the pressure; (b) inputting the signal for opening the secondary valve; (c) measuring, by the secondary pressure gauge, a pressure P on the downstream side of the orifice of the flow rate controller at the time point when the period t elapses from the input of the signal for opening the secondary valve; (d) measuring, by the secondary pressure gauge, a standard deviation σ of the pressure P on the downstream side of the orifice of the flow rate controller at the time point when the period t elapses from the input of the signal for opening the secondary valve; and (e) determining whether or not an open degree of the secondary valve is normal by comparing the pressure P measured in (c) and the standard deviation σ of the pressure P measured in (d) with the threshold value P0 of the pressure and the threshold value σ0 of the standard deviation of the pressure, which are set in (a), respectively.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
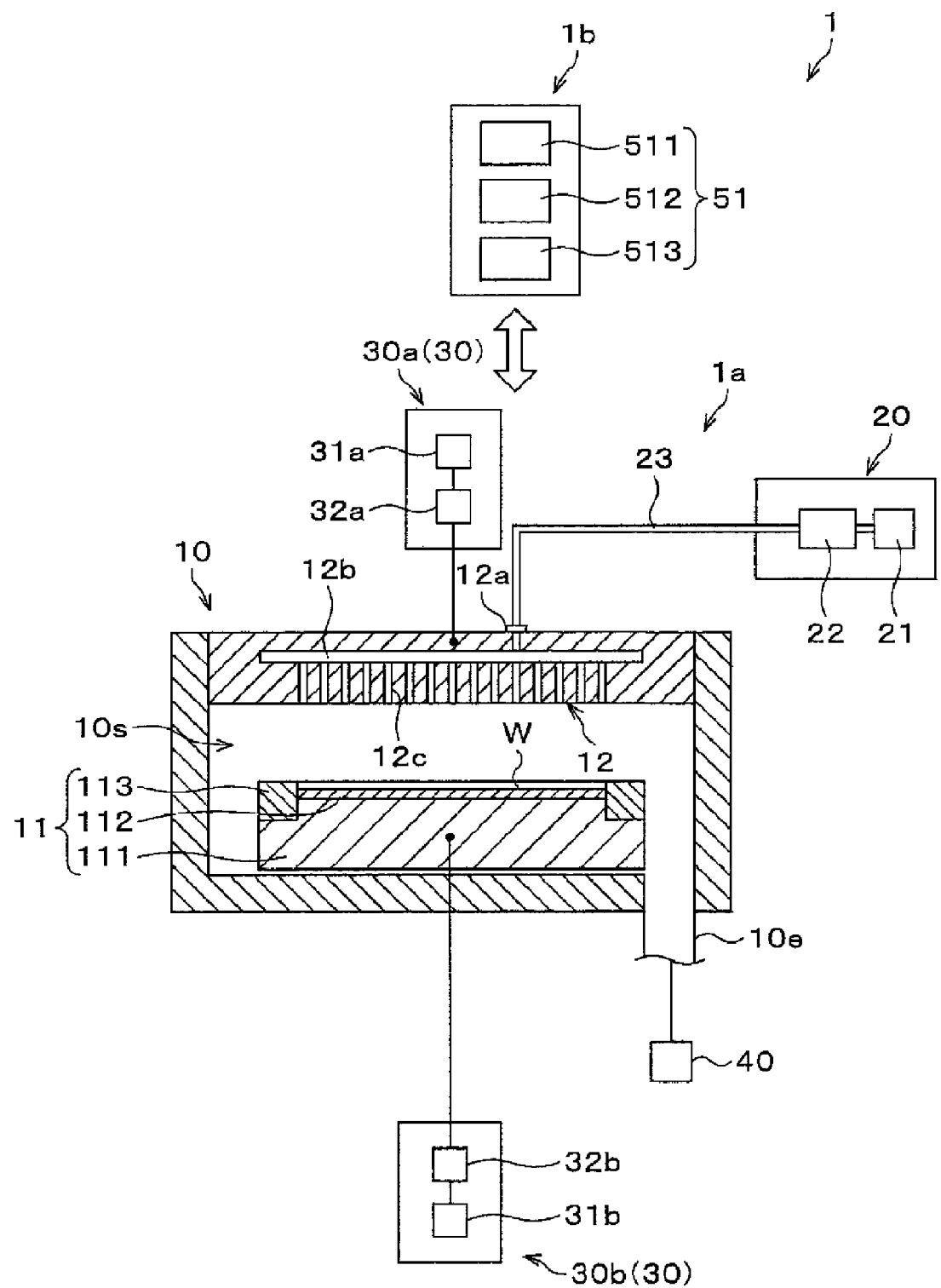
FIG. 1 is an explanatory view schematically illustrating a configuration of a plasma processing system.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

In a semiconductor device manufacturing process, a plasma processing apparatus generates plasma by exciting a processing gas, and processes a semiconductor wafer (hereinafter, referred to as a "wafer") using the plasma. In the plasma processing apparatus, a gas is supplied from a gas supply into a chamber, and the wafer is processed.

It is necessary to strictly control an amount of gas supplied from the gas supply. However, when a flow rate of the gas differs from a set value due to a defect in the apparatus, a processing in the chamber may not be correctly performed and a scrap wafer may be generated. Patent Document 1 discloses a method of inspecting a gas supply for supplying a gas into a chamber of a plasma processing apparatus. Specifically, a normal opening and closing of a secondary valve provided at a downstream side of a flow rate controller is controlled such that, in a state in which the secondary valve is open, an alarm signal is output when a difference between a primary pressure value measured by a primary pressure gauge provided at an upstream side of an orifice and a secondary pressure value measured by a secondary pressure gauge provided at a downstream side of the orifice is greater than a threshold value, or when the secondary pressure value is greater than a threshold value.

In the method of inspecting the gas supply disclosed in Patent Document 1, in a case that a defect occurs in the opening and closing operation of the secondary valve, the defect can be detected without any problem when the secondary pressure value rises to a detectable extent. However, in a case that a defect in which the secondary valve is opened with an open degree smaller than a desired open degree, since the secondary pressure value may be stabilized at a desired pressure value with a lapse of a certain period of time after an input of a signal to open the secondary valve, the defect may be indistinguishable from a case where the secondary valve is opened with a normal open degree. In addition, it is impossible to detect a defect in which the secondary valve is opened to a desired open degree with a lapse of a certain period of time after the input of the signal to open the secondary valve but is unstably opened immediately after the input of the signal to open the second valve. Although the opening and closing operation of the secondary valve can be identified by adding an opening and closing sensor, such a method necessitates modifying the apparatus, which leads to an increase in cost. Therefore, there is a need for a method of monitoring behavior when opening the secondary valve without adding a hardware component such as an opening and closing sensor.

The technique according to the present disclosure appropriately inspects the behavior when opening the secondary valve without adding the above-mentioned hardware component. Hereinafter, a plasma processing system and a plasma processing method as a substrate processing system and a substrate processing method according to an embodiment, respectively, and a gas inspection method will be described with reference to the drawings. In the present specification and the accompanying drawings, elements having substantially the same functional configurations will be denoted by the same reference numerals and redundant explanations will be omitted.

<Plasma Processing System>

First, a plasma processing system according to an embodiment will be described. FIG. 1 is an explanatory view schematically illustrating a configuration of a plasma processing system 1. In the plasma processing system 1, a plasma processing is performed on a wafer W as a substrate. The plasma processing is not particularly limited, but, for example, an etching process, a film formation process, and a diffusion process are performed.

In an embodiment, the plasma processing system 1 includes a plasma processing apparatus 1a and a controller 1b. The plasma processing apparatus 1a includes a plasma processing chamber 10, a gas supply 20, a radio-frequency (RF) power supply 30, and an exhaust system 40. In addition, the plasma processing apparatus 1a includes a support 11 and an upper electrode shower head 12. The support 11 is disposed below a plasma processing space 10s in the plasma processing chamber 10. The upper electrode shower head 12 is disposed above the support 11, and may function as a portion of a ceiling of the plasma processing chamber 10.

The support 11 is configured to support the wafer W in the plasma processing space 10s. In an embodiment, the support 11 includes a lower electrode 111, an electrostatic chuck 112, and an edge ring 113. The electrostatic chuck 112 is disposed on the lower electrode 111 and configured to support the wafer W on a top surface thereof. The edge ring 113 is disposed on a top surface of a peripheral edge portion of the lower electrode 111 so as to surround the wafer W. Although not illustrated, in an embodiment, the support 11 may include a temperature adjustment module configured to adjust the temperature of at least one of the electrostatic chuck 112 and the wafer W to a target temperature. The temperature adjustment module may include a heater, a flow path, or a combination thereof. A temperature adjustment fluid, such as a coolant or a heat transfer gas, flows through the flow path.

The upper electrode shower head 12 is configured to supply one or more processing gases from the gas supply 20 to the plasma processing space 10s. In an embodiment, the upper electrode shower head 12 has a gas inlet 12a serving as a gas supply port, a gas diffusion chamber 12b, and a plurality of gas outlets 12c. The gas inlet 12a is in communication with the gas supply 20 and the gas diffusion chamber 12b. The plurality of gas outlets 12c is in fluid communication with the gas diffusion chamber 12b and the plasma processing space 10s. In an embodiment, the upper electrode shower head 12 is configured to supply one or more processing gases from the gas inlet 12a to the plasma processing space 10s via the gas diffusion chamber 12b and the plurality of gas outlets 12c.

The gas supply 20 may include one or more gas sources 21, one or more flow rate controllers 22, and one or more gas supply pipes 23. In an embodiment, the gas supply 20 is configured to supply one or more processing gases from the respectively corresponding gas sources 21 to the gas inlet 12a via the respectively corresponding flow rate controllers 22 and gas supply pipes 23. Each flow rate controller 22 may include, for example, a so-called pressure-controlled flow rate controller configured to control a flow rate by a pressure of the processing gas. In addition, the gas supply 20 may include one or more flow rate modulation devices configured to modulate or pulse the flow rates of one or more processing gases.

The RF power supply 30 is configured to supply RF power, for example, one or more RF signals, to one or more electrodes, such as the lower electrode 111, an upper electrode shower head 12, or both the lower electrode 111 and the upper electrode shower head 12. With this configuration, plasma is generated from the one or more processing gases supplied to the plasma processing space 10s. Therefore, the RF power supply 30 is capable of functioning as at least a part of a plasma generator configured to generate plasma from one or more processing gases in the plasma processing chamber. In an embodiment, the RF power supply 30 includes a first RF power supply 30a and a second RF power supply 30b.

The first RF power supply 30a includes a first RF generator 31a and a first matching circuit 32a. In an embodiment, the first RF power supply 30a is configured to supply a first RF signal from the first RF generator 31a to the upper electrode shower head 12 via the first matching circuit 32a. For example, the first RF signal may have a frequency within a range of 27 MHz to 100 MHz.

The second RF power supply 30b includes a second RF generator 31b and a second matching circuit 32b. In an embodiment, the second RF power supply 30b is configured to supply a second RF signal from the second RF generator 31b to the lower electrode 111 via the second matching circuit 32b. For example, the second RF signal may have a frequency within a range of 400 kHz to 13.56 MHz. Alternatively, a direct current (DC) pulse generator may be used instead of the second RF generator 31b.

In addition, although not illustrated, other embodiments can be considered in the present disclosure. For example, in an alternative embodiment, the RF power supply 30 may be configured to supply a first RF signal from an RF generator to the lower electrode 111, to supply a second RF signal from another RF generator to the lower electrode 111, and to supply a third RF signal from still another RF generator to the upper electrode shower head 12. In addition, in another alternative embodiment, a DC voltage may be applied to the upper electrode shower head 12.

Furthermore, in various embodiments, amplitudes of one or more RF signals (i.e., the first RF signal, the second RF signal, and the like) may be pulsed or modulated. Amplitude modulation may include pulsing an amplitude of an RF signal between ON and OFF states, or between two or more different ON states.

The exhaust system 40 may be connected to, for example, a gas exhaust port 10e provided in a bottom portion of the plasma processing chamber 10. The exhaust system 40 may include a pressure valve and a vacuum pump. The vacuum pump may include a turbo molecular pump, a rough vacuum pump, or a combination thereof.

In an embodiment, the controller 1b processes computer-executable instructions that cause the plasma processing apparatus 1a to perform various processes described in the present disclosure. The controller 1b may be configured to control respective components of the plasma processing apparatus 1a to perform various processes described herein. In an embodiment, a part or all of the controller 1b may be included in the plasma processing apparatus 1a. The controller 1b may include, for example, a computer 51. The computer 51 may include, for example, a processor (central processing unit (CPU)) 511, a storage 512, and a communication interface 513. The processor 511 may be configured to perform various control operations based on a program stored in the storage 512. The storage 512 may include a random access memory (RAM), a read only memory (ROM), a hard disk drive (HDD), a solid state drive (SSD), or a combination thereof. The communication interface 513 may communicate with the plasma processing apparatus 1a via a communication line such as a local area network (LAN).

<Gas Supply>

Figure 2:
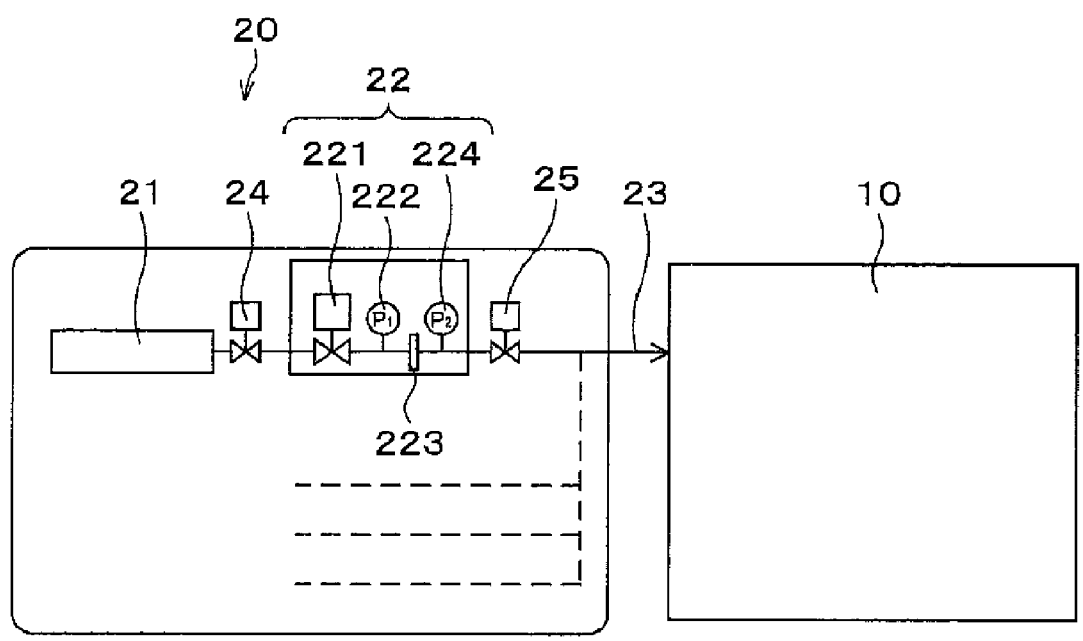
FIG. 2 is an explanatory view schematically illustrating a configuration of a gas supply.

Next, the above-described gas supply 20 will be described. FIG. 2 is an explanatory view schematically illustrating a configuration of the gas supply 20.

As described above, the gas supply 20 includes one or more gas sources 21, one or more flow rate controllers 22, and one or more pipes 23. In addition, the gas supply 20 further includes one or more primary valves 24 and one or more secondary valves 25. In the pipes 23, the primary valve 24 is provided between the gas source 21 and the flow rate controller 22, and the secondary valve 25 is disposed on a downstream side of the flow rate controller 22. A set of one gas source 21, one flow rate controller 22, one pipe 23, one primary valve 24, and one secondary valve 25 is provided for each type of the processing gas.

Each flow rate controller 22 includes a piezo valve 221, a primary pressure gauge 222, an orifice 223, and a secondary pressure gauge 224. The piezo valve 221, the primary pressure gauge 222, the orifice 223, and the secondary pressure gauge 224 are provided in this order from an upstream side to a downstream side in the pipe 23. In the following description, a pressure measured by the primary pressure gauge 222 may be referred to as a primary pressure P1, and a pressure measured by the secondary pressure gauge 224 may be referred to as a secondary pressure P2. The flow rate controller 22 measures a pressure of the processing gas, and converts the pressure value into a flow rate value to control the flow rate of the processing gas.

Although various exemplary embodiments have been described above, the present disclosure is not limited to the exemplary embodiments described above, and various omissions, substitutions, and changes may be made. In addition, elements in different embodiments may be combined to form other embodiments.

<Plasma Processing Method>

Next, a plasma processing performed using the plasma processing system 1 configured as described above will be described.

First, the wafer W is carried into the plasma processing chamber 10 and placed on the electrostatic chuck 112. Thereafter, by applying a DC voltage to an electrodes of the electrostatic chuck 112, the wafer W is electrostatically attracted to and held by the electrostatic chuck 112 by Coulomb force. In addition, after the wafer W is carried in, the interior of the plasma processing chamber 110 is depressurized to a desired degree of vacuum by the exhaust system 40.

Subsequently, a processing gas is supplied from the gas supply 20 to the plasma processing space 10s via the upper electrode shower head 12. In addition, the RF power supply 30 supplies radio-frequency power HF for plasma generation to the upper electrode shower head 12 to excite the processing gas and generate plasma. At this time, the RF power supply 30 may supply radio-frequency power LF for ion attraction to the lower electrode 111. Thus, the plasma processing is performed on the wafer W by action of the generated plasma.

When the plasma processing is completed, first, the supply of the radio-frequency power HF from the RF power supply 30 and the supply of the processing gas by the gas supply 20 are stopped. In addition, when the radio-frequency power LF is supplied during the plasma processing, the supply of the radio-frequency power LF is also stopped. Subsequently, a supply of a heat transfer gas to a rear surface of the wafer W is stopped, and the attraction and holding of the wafer W by the electrostatic chuck 112 is stopped.

Thereafter, the wafer W is carried out from the plasma processing chamber 110, and a series of plasma processing on the wafer W are completed.

<Gas Inspection Method>

In the gas supply 20 configured as described above, when a gas is supplied from the gas source 21, the secondary valve 25 is opened to a desired open degree in response to a signal for opening the secondary valve 25 transmitted from the controller 1b to the secondary valve 25. When the secondary valve 25 is not opened to the desired open degree due to a defect in the apparatus or the like, it is impossible to set the secondary pressure P2 to a predetermined pressure (hereinafter, referred to as a "set pressure"), and it also impossible to set a flow rate calculated based on the secondary pressure P2 to a predetermined flow rate (hereinafter, referred to as a "set flow rate"). Therefore, it is necessary to inspect whether or not the secondary valve 25 has been opened normally to the desired open degree after receiving the signal for opening the secondary valve 25.

In this regard, the present inventors verified a case where the secondary valve 25 is not normally opened after the signal for opening the secondary valve 25 is input, and obtained the following findings. That is, when the secondary valve 25 is not normally opened, compared to a case where the secondary valve 25 is normally opened, (1) the secondary pressure P2 with a lapse of a certain period of time after the input of the signal for opening the secondary valve 25 becomes higher. In addition, (2) a standard deviation of the secondary pressure P2 in a certain period of time after the input of the signal for opening the secondary valve 25 becomes large. Regarding the findings (1) and (2) described above, FIG. 3 is a graph showing a relationship between a set flow rate, and a pressure and a flow rate in a certain period of time before and after the input of the signal for opening the secondary valve 25.

Figure 3:
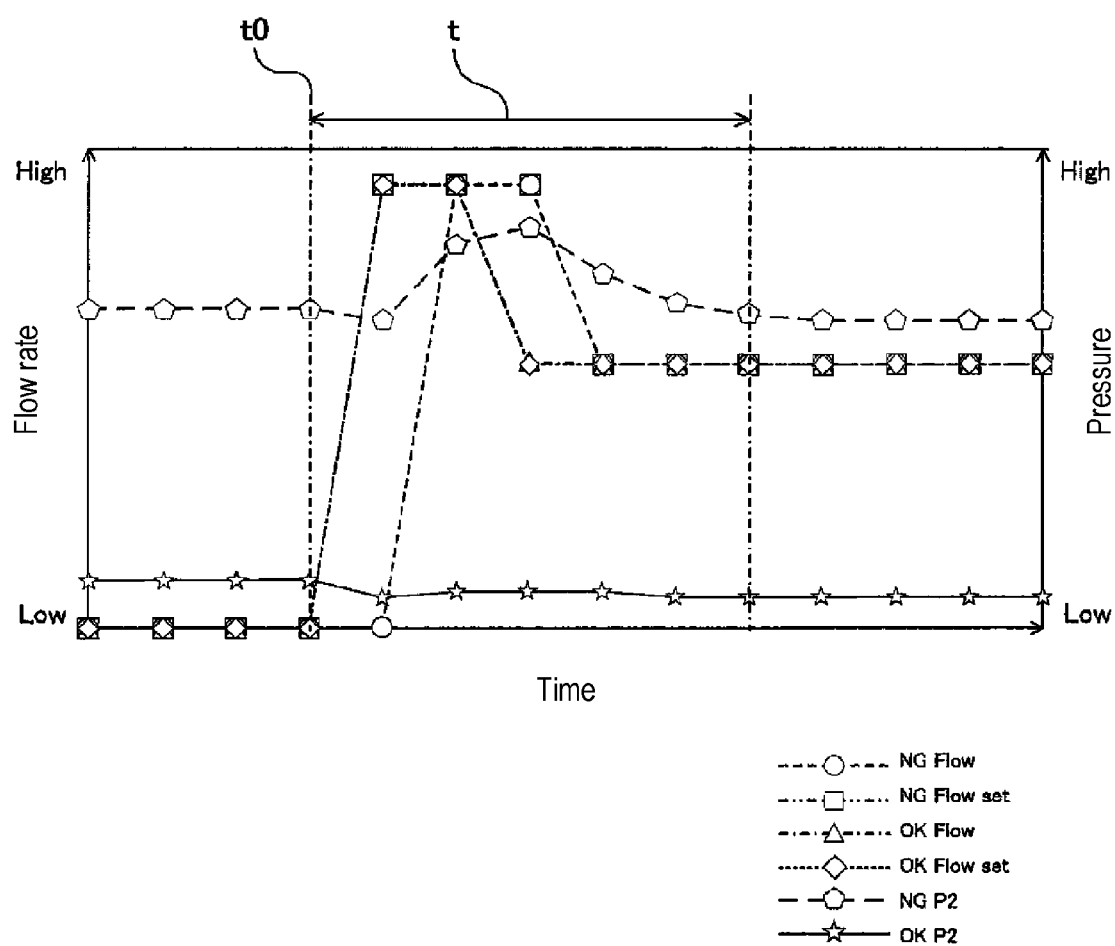
FIG. 3 is a graph showing a relationship between a pressure and a flow rate with respect to time when an opening and closing behavior of a secondary valve is normal and abnormal, respectively.

In FIG. 3, t0 indicates a time at which the signal for opening the secondary valve 25 is input. In addition, t indicated by the double-headed arrow indicates a period of, for example, five seconds from t0. After the input of the signal for opening the secondary valve 25 at t0, transition of the set flow rate and transition of the flow rate when the secondary valve 25 was normally opened are indicated as "OK Flow set" and "OK Flow," respectively, and transition of the set flow rate and transition of the flow rate when the secondary valve 25 was not normally opened are indicated as "NG Flow set" and "NG Flow," respectively. In addition, after the input of the signal for opening the secondary valve 25, a pressure in the secondary pressure gauge 224 after a lapse of the period t when the secondary valve 25 was normally opened is indicated as "OK P2," and the pressure in the secondary pressure gauge 224 after the lapse of the period t when the secondary valve 25 was not been normally opened is indicated as "NG P2."

As obtained in FIG. 3, it can be confirmed that when the secondary valve 25 was normally opened, the flow rate transitioned according to a value close to the set flow rate, whereas when the secondary valve 25 was not normally opened, the measured flow rate transitioned with a gap from the set flow rate.

When the secondary valve 25 was normally opened, the pressure after the lapse of the period t was 10 kPa or less, and the standard deviation of the pressure was 1 kPa or less. In contrast, when the secondary valve 25 was not normally opened, the pressure after the lapse of the period t was 30 kPa or more, and the standard deviation of the pressure was 5 kPa or more. The standard deviation of the pressure was calculated based on a pressure continuously measured by the secondary pressure gauge 224 for a period of five seconds after the input of the signal for opening the secondary valve 25.

Regarding the finding (1) described above, it can be confirmed that from FIG. 3, when the secondary valve 25 is not normally opened, since the secondary pressure P2 does not decrease even with a laps of a certain period of time after the input of the signal for opening the secondary valve 25, at least the open degree of the secondary valve 25 is not sufficient, and the gas supplied from the gas source 21 remains in an upstream side of the secondary valve 25.

Regarding the finding (2) described above, the standard deviation of the measured pressure value when the secondary valve 25 was not normally opened was larger than the standard deviation of the measured pressure when the secondary valve 25 was normally opened. Thus, it can be confirmed that whether or not the secondary valve 25 is normally opened is correlated with the standard deviation of the secondary pressure P2 for a certain period of time after the input of the signal for opening the secondary valve 25. The reason for such a correlation is considered that the open degree of the secondary valve 25 increases at a constant speed or a constant acceleration when the secondary valve 25 is normally opened, whereas the open degree of the secondary valve 25 changes irregularly and the secondary pressure P2 varies accordingly when the secondary valve 25 is not been normally opened.

Based on the findings (1) and (2) described above, in the method of inspecting the gas supply 20 according to the present embodiment, the pressure (the secondary pressure P2) and the standard deviation of the pressure with a lapse of a certain period of time after the input of the signal for opening the secondary valve 25 are measured to inspect whether or not the secondary valve 25 is normally opened.

Figure 4:
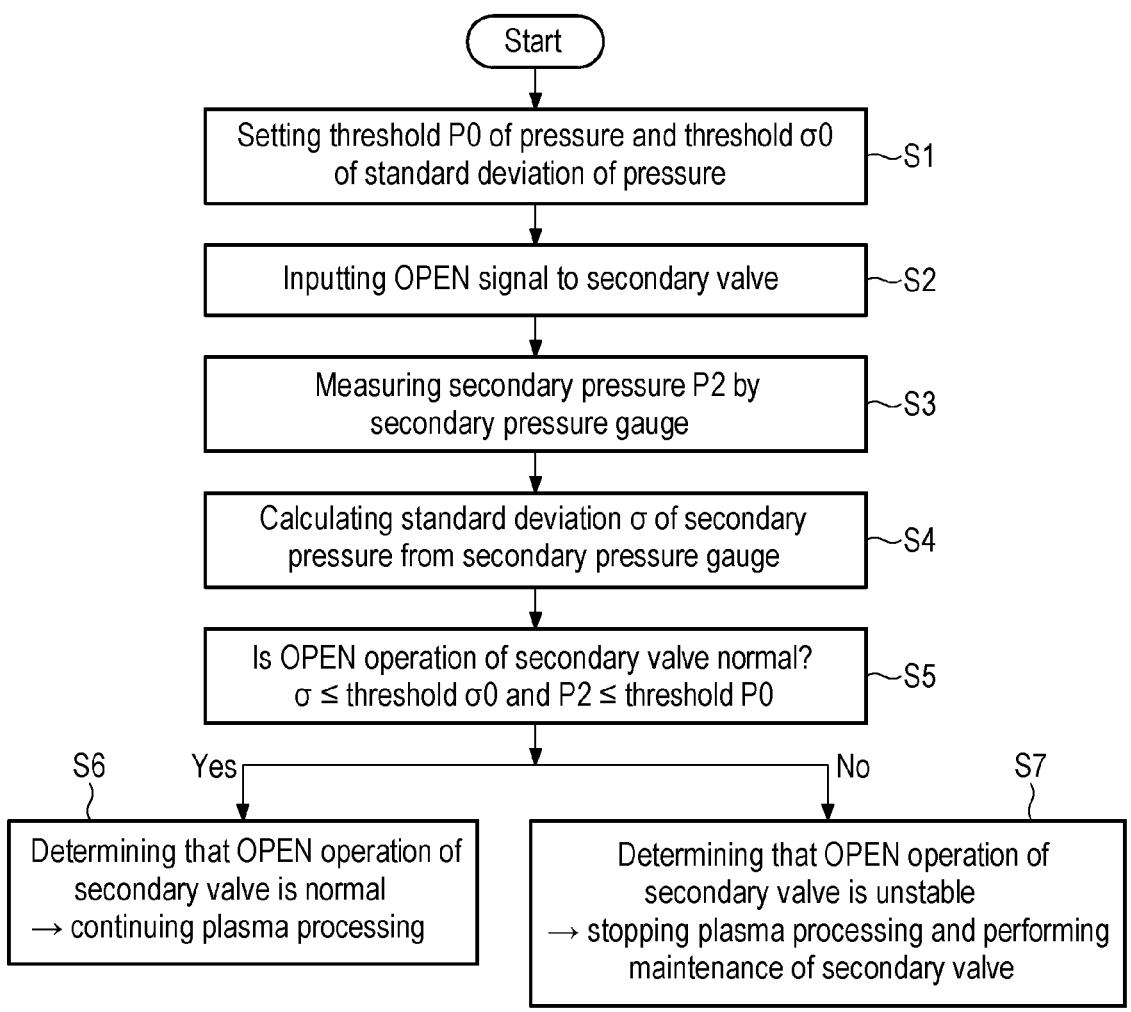
FIG. 4 is a flowchart illustrating exemplary main processes of a method of inspecting a gas supply.

FIG. 4 is a flow chart illustrating exemplary main processes of the method of inspecting the gas supply 20 according to the present embodiment.

(Step S1)

In step S1, a threshold value P0 of a pressure and a threshold value $\sigma 0$ of a standard deviation of the pressure, which serve as references for inspecting the secondary valve 25, are set from the pressure (secondary pressure P2) measured by the secondary pressure gauge 224 when the secondary valve 25 is normally opened and the standard deviation of the secondary pressure P2. The threshold value P0 of the pressure and the threshold value $\sigma 0$ of the standard deviation of the pressure may be appropriately determined according to processing conditions such as a type and flow rate of the gas supplied by the gas supply 20, and are not particularly limited. For example, in the example of FIG. 3, concerning the pressure when the secondary valve 25 is not normally opened, it is possible to detect a defect through step S7 to be described later by setting the threshold value P0 of the pressure to 50 kPa. In addition, concerning the standard deviation of the pressure when the secondary valve 25 is not normally opened, it is possible to detect a defect through step S7 to be described later by setting the threshold value $\sigma 0$ of the standard deviation of the pressure to 5 kPa.

Alternatively, under specific processing conditions, a pressure P and a standard deviation G of the pressure are measured a plurality of times in a normally opened (initial) state of the secondary valve 25, and the threshold value P0 of the pressure and the threshold value $\sigma 0$ of the standard deviation of the pressure may be determined based on the obtained measured values. In an example, the threshold value P0 of the pressure and the threshold value $\sigma 0$ of the standard deviation of the pressure may be obtained by multiplying a maximum value of the measured pressures P and a maximum value of the measured standard deviations $\sigma$ of the pressure by arbitrary coefficients, respectively. The arbitrary coefficients may be selected from a range of 1 to 8, specifically, 4 to 6, for both the pressure P and the standard deviation $\sigma$ of the pressure, for example.

As a result of experiments, the present inventors have confirmed that, in some embodiments, the threshold value P0 of the pressure may be selected from a range of 10 kPa to 30 kPa, and the threshold value $\sigma 0$ of the standard deviation of the pressure may be selected from a range of 1 kPa to 5 kPa. When the threshold value P0 of the pressure is less than 10 kPa or the threshold value $\sigma 0$ of the standard deviation of the pressure is less than 1 kPa, the secondary valve 25 may be determined as abnormal even when the secondary valve 25 is normal, due to an influence of a measurement error, a communication error, or the like. In contrast, when the threshold value P0 of the pressure exceeds 30 kPa or the threshold value $\sigma 0$ of the standard deviation of the pressure exceeds 5 kPa, an abnormality of the secondary valve 25 can be detected even with the conventional system described in Patent Document 1 described above.

(Step S2)

In step S2, the signal for opening the secondary valve 25 is input following a start of a gas supply from the gas source 21.

(Step S3)

In step S3, the pressure P (secondary pressure P2) is measured by the secondary pressure gauge 224 at a time point when the period t elapses after the signal for opening the secondary valve 25 is input in step S2. In the present embodiment, the period t is, for example, five seconds. In addition, as a result of earnest examination by the present inventors, it was confirmed that the period t may be five seconds to ten seconds in some embodiments. When the period t is less than five seconds, the secondary valve 25 may be determined as abnormal even when the secondary valve 25 is in the normally opened state, due to the influence of the measurement error, the communication error, or the like. In addition, when the period t exceeds ten seconds, in a case that a defect in which the open degree of the secondary valve 25 is unstable occurs, the secondary valve 25 may be fully opened to stabilize the open degree and the standard deviation of the pressure becomes small, whereby the defect may be indistinguishable from the normal state.

(Step S4)

In step S4, the standard deviation $\sigma$ of the pressure is calculated from the secondary pressure P2 measured a plurality of times by the secondary pressure gauge 224 during the period t after the signal for opening the secondary valve 25 is input in step S2.

(Step S5)

In step S5, it is determined whether or not the secondary pressure P2 measured in step S3 is equal to or less than the threshold value P0 of the pressure set in step S1, and it is also determined whether or not the standard deviation $\sigma$ of the pressure calculated in step S4 is equal to or less than the threshold value $\sigma 0$ of the standard deviation of the pressure set in step S1.

(Step S6)

In step S6, when it is determined in step S5 that the pressure P measured in step S3 is equal to or less than the threshold value P0 of the pressure set in step S1 (P≤P0), and that the standard deviation $\sigma$ of the pressure calculated in step S4 is equal to or less than the threshold value $\sigma 0$ of the standard deviation of the pressure set in step S1 ($\sigma \leq \sigma 0$), the operation of opening the secondary valve 25 is determined to be normal, and the plasma processing continues.

(Step S7)

In step S7, when it is determined in step S5 that the pressure P measured in step S3 is greater than the threshold value P0 of the pressure set in step S1 (P>P0), or that the standard deviation $\sigma$ of the pressure calculated in step S4 is greater than the threshold value $\sigma 0$ of the standard deviation of the pressure set in step S1 ($\sigma > \sigma 0$), the operation of opening the secondary valve 25 is determined to be unstable, and the plasma processing is stopped.

According to the embodiments described above, it is possible to appropriately inspect the gas supply 20 for supplying the gas into the plasma processing chamber 10 of the plasma processing apparatus 1a, and to appropriately inspect, in particular, the behavior when the secondary valve 25 is opened. That is, by comparing the measured secondary pressure P2 with the threshold value P0 of the pressure and comparing the standard deviation $\sigma$ of the pressure with the threshold value $\sigma 0$ of the standard deviation of the pressure, it is possible to appropriately inspect the behavior when the secondary valve 25 is opened.

According to the present disclosure, it is possible to appropriately inspect the gas supply for supplying the gas into the processing container of the substrate processing apparatus, and to appropriately inspect, in particular, the behavior when the secondary valve is opened.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A gas inspection method of inspecting a gas supply configured to supply a gas into a chamber, wherein the gas supply includes a pipe configured to connect a gas source and the chamber to each other, a flow rate controller provided in the pipe, a primary valve provided on an upstream side of the flow rate controller, and a secondary valve provided on a downstream side of the flow rate controller, and wherein the flow rate controller includes an orifice, a primary pressure gauge provided on an upstream side of the orifice, and a secondary pressure gauge provided on a downstream side of the orifice, the method comprising:

(a) setting, in the flow rate controller, a threshold value P0 of a pressure on the downstream side of the orifice of the flow rate controller at a time point when a period t elapses from an input of a signal for opening the secondary valve, and a threshold value $\sigma 0$ of a standard deviation of the pressure;

(b) inputting the signal for opening the secondary valve;

(c) measuring, by the secondary pressure gauge, a pressure P on the downstream side of the orifice of the flow rate controller at the time point when the period t elapses from the input of the signal for opening the secondary valve;

(d) measuring, by the secondary pressure gauge, a standard deviation $\sigma$ of the pressure P on the downstream side of the orifice of the flow rate controller at the time point when the period t elapses from the input of the signal for opening the secondary valve; and (e) determining whether or not an open degree of the secondary valve is normal by comparing the pressure P measured in (c) and the standard deviation $\sigma$ of the pressure P measured in (d) with the threshold value P0 of the pressure and the threshold value $\sigma 0$ of the standard deviation of the pressure, which are set in (a), respectively.

2. The gas inspection method of claim 1, wherein the threshold value P0 of the pressure, which is set in (a), on the downstream side of the orifice of the flow rate controller at the time point when the period t elapses after the input of the signal for opening the secondary valve is 10 kPa to 30 kPa, and the threshold value $\sigma 0$ of the standard deviation of the pressure is 1 kPa to 5 kPa.

3. The gas inspection method of claim 1, wherein the period t in (a), (b), and (c) is five seconds to ten seconds.

4. The gas inspection method of claim 1, wherein (a) includes setting the threshold value P0 of the pressure and the threshold value $\sigma 0$ of the standard deviation of the pressure from the pressure P measured by the secondary pressure gauge when the secondary valve is normally opened and a standard deviation of the pressure P measured by the secondary pressure gauge when the secondary valve is normally opened, respectively.

5. The gas inspection method of claim 1, further comprising:

(i) when the pressure P measured in (c) is determined in (e) to be equal to or less than the threshold value P0 of the pressure set in (a) and the standard deviation $\sigma$ of the pressure P measured in (d) is determined in (e) to be equal to or less than the threshold value $\sigma 0$ of the standard deviation of the pressure set in (a), determining that an operation of opening the secondary valve is normal and continuing processing a substrate.

6. A substrate processing method, comprising:

the method of inspecting the gas supply according to claim 1, wherein a substrate is processed using the gas supplied from the gas supply.

7. The gas inspection method of claim 1, wherein (a) includes:

(f) measuring, a plurality of times by the secondary pressure gauge, the pressure P when the secondary valve is in a normally opened state under specific processing conditions and a standard deviation of the pressure P when the secondary valve is in the normally opened state under the specific processing conditions; and (g) setting the threshold value P0 of the pressure and the threshold value σ0 of the standard deviation of the pressure based on the pressures and standard deviations measured in (f), respectively.

8. The gas inspection method of claim 7, wherein (g) includes setting the threshold value P0 of the pressure and the threshold value σ0 of the standard deviation of the pressure to be values obtained by multiplying a maximum value among the pressures measured in (f) by a first coefficient and multiplying a maximum value among the standard deviations measured in (f) by a second coefficient, respectively.

9. The gas inspection method of claim 8, wherein each of the first coefficient and the second coefficient falls within a range of 1 to 8.

10. A system for processing a substrate using a gas, the system comprising:

a chamber including a gas supply port and a gas exhaust port;

a gas supply configured to supply the gas to the chamber; and a controller, wherein the gas supply includes a pipe configured to connect a gas source and the chamber to each other, a flow rate controller provided in the pipe, a primary valve provided on an upstream side of the flow rate controller, and a secondary valve provided on a downstream side of the flow rate controller, wherein the flow rate controller includes an orifice, a primary pressure gauge provided on an upstream side of the orifice, and a secondary pressure gauge provided on a downstream side of the orifice, and wherein the controller is configured to control the system to execute a processing including processes of:

(a) setting, in the flow rate controller, a threshold value P0 of a pressure on the downstream side of the orifice of the flow rate controller at a time point when a period t elapses from an input of a signal for opening the secondary valve, and a threshold value σ0 of a standard deviation of the pressure;

(b) inputting the signal for opening the secondary valve;

(c) measuring, by the secondary pressure gauge a pressure P on the downstream side of the orifice of the flow rate controller at the time point when the period t elapses from the input of the signal for opening the secondary valve;

(d) measuring, by the secondary pressure gauge a standard deviation σ of the pressure P on the downstream side of the orifice of the flow rate controller at the time point when the period t elapses from the input of the signal for opening the secondary valve; and (e) determining whether or not an open degree of the secondary valve is normal by comparing the pressure P measured in (c) and the standard deviation σ of the pressure P measured in (d) with the threshold value P0 of the pressure and the threshold value σ0 of the standard deviation of the pressure, which are set in (a).

* * * * *

UNITED STATES PATENT AND TRADEMARK OFFICE
CERTIFICATE OF CORRECTION

PATENT NO. : 11,644,121 B2
APPLICATION NO. : 17/189804
DATED : May 9, 2023
INVENTOR(S) : Risako Matsuda and Norihiko Amikura Page 1 of 1

It is certified that error appears in the above-identified patent and that said Letters Patent is hereby corrected as shown below:

In the Claims

Claim 3, Column 10, Line 52, please remove the phrase "period tin (a)," and replace with "period t in (a),".

Signed and Sealed this
Twentieth Day of June, 2023

Katherine Kelly Vidal
*Director of the United States Patent and Trademark Office*